United States Patent
Sanduleanu et al.

(10) Patent No.: US 10,455,529 B2
(45) Date of Patent: Oct. 22, 2019

(54) MULTI-STANDARD TRANSMITTER ARCHITECTURE WITH DIGITAL UPCONVERT STAGE AND GALLIUM NITRIDE (GAN) AMPLIFIER CIRCUIT

(71) Applicant: Khalifa University of Science and Technology, Abu Dhabi (AE)

(72) Inventors: Mihai Sanduleanu, Abu Dhabi (AE); Shoeb Shaikh, Abu Dhabi (AE)

(73) Assignee: Khalifa University of Science and Technology (AE)

( * ) Notice: Subject to any disclaimer, the term of this patent is extended or adjusted under 35 U.S.C. 154(b) by 0 days.

(21) Appl. No.: 15/974,809

(22) Filed: May 9, 2018

(65) Prior Publication Data
US 2018/0332545 A1    Nov. 15, 2018

Related U.S. Application Data

(60) Provisional application No. 62/503,555, filed on May 9, 2017.

(51) Int. Cl.
| | |
|---|---|
| *H04B 1/04* | (2006.01) |
| *H03F 1/02* | (2006.01) |
| *H04W 52/52* | (2009.01) |
| *H04W 52/42* | (2009.01) |
| *H03F 3/217* | (2006.01) |
| *H03F 3/195* | (2006.01) |

(Continued)

(52) U.S. Cl.
CPC .......... *H04W 52/52* (2013.01); *H03F 1/0227* (2013.01); *H03F 1/0288* (2013.01); *H03F 1/0294* (2013.01); *H03F 3/195* (2013.01); *H03F 3/2178* (2013.01); *H03F 3/265* (2013.01); *H03F 3/45183* (2013.01); *H03F 3/68* (2013.01); *H04B 1/04* (2013.01); *H04B 1/0475* (2013.01); *H04W 52/42* (2013.01); *H03F 2200/102* (2013.01); *H03F 2200/111* (2013.01); *H04B 2001/045* (2013.01)

(58) Field of Classification Search
None
See application file for complete search history.

(56) References Cited

U.S. PATENT DOCUMENTS

| | | | | |
|---|---|---|---|---|
| 4,926,440 | A * | 5/1990 | Mikoshiba | ......... H04B 1/70718 375/145 |
| 8,957,722 | B2 * | 2/2015 | Zienkewicz | ........... H03D 7/165 455/313 |

(Continued)

*Primary Examiner* — Lana N Le
(74) *Attorney, Agent, or Firm* — Grossman Tucker Perreault & Pfleger PLLC

(57) ABSTRACT

A multi-standard transmitter architecture with digitally upconverted intermediate frequency (IF) outphased signals is disclosed. The transmitter architecture includes a Gallium Nitride (GaN) power amplifier (PA) circuit having a Current Mode Class-D (CMCD) configuration. The GaN PA circuit includes a lower switching device electrically coupled to an input to receive an input RF signal and an upper switching device to switchably electrically couple the first switching device to a power supply to drive an antenna circuit based on the input RF signal. Thus, a reconfigurable transmitter architecture is disclosed that utilizes a high-speed Gallium Nitride (GaN) driver to achieve a peak drain efficiency of at least 85% while delivering output power of 10 W at 1 GHz frequency, for example.

21 Claims, 12 Drawing Sheets

(51) Int. Cl.
 *H03F 3/26* (2006.01)
 *H03F 3/45* (2006.01)
 *H03F 3/68* (2006.01)

(56) References Cited

U.S. PATENT DOCUMENTS

| | | | | |
|---|---|---|---|---|
| 2005/0083134 | A1* | 4/2005 | Kapoor | H03F 1/30 330/302 |
| 2007/0290645 | A1* | 12/2007 | Boyadjieff | H02J 3/1892 318/437 |
| 2008/0106447 | A1* | 5/2008 | Zare-Hoseini | H03M 3/372 341/135 |
| 2010/0029239 | A1* | 2/2010 | Asuri | H03D 7/1441 455/333 |
| 2010/0182180 | A1* | 7/2010 | Ikoma | H03M 1/0604 341/144 |
| 2010/0231193 | A1* | 9/2010 | Nascimento | H03K 17/08142 323/315 |
| 2011/0133890 | A1* | 6/2011 | Duron | G06K 7/0008 455/63.1 |
| 2012/0119808 | A1* | 5/2012 | Motozawa | H04B 1/40 327/270 |
| 2014/0184328 | A1* | 7/2014 | Binet | H03F 3/2171 330/251 |
| 2015/0364819 | A1* | 12/2015 | Ngo | H01Q 3/30 342/368 |
| 2016/0146677 | A1* | 5/2016 | Park | G01K 7/16 374/185 |
| 2017/0070308 | A1* | 3/2017 | Hahn, III | H03F 1/02 |
| 2018/0097486 | A1* | 4/2018 | Salem | H03F 3/2173 |

* cited by examiner

MULTI-STANDARD TRANSMITTER ARCHITECTURE WITH DIGITAL UPCONVERT STAGE AND GALLIUM NITRIDE (GAN) AMPLIFIER CIRCUIT

CROSS REFERENCE TO RELATED APPLICATIONS

This application claims the benefit of priority to U.S. Provisional Application No. 62/503,555, filed May 9, 2017, the entire content of which is incorporated by reference.

TECHNICAL FIELD

The present disclosure relates generally to radio frequency (RF) transmitters, and more particularly, to a reconfigurable transmitter architecture for supporting multiple standards with an an output stage utilizing a high-speed Gallium Nitride (GaN) driver to achieve a peak drain efficiency of at least 85%.

BACKGROUND INFORMATION

With increasing demand in wireless data communication, the race to bundle more and more data over a wireless link has intensified. This has led to the emergence of newer standards having larger peak-to-average power ratios (PAPRs) operating at relatively higher frequencies with larger bandwidths. One approach to accommodating multiple standards within a single transmitter device includes utilizing a parallel stack of power amplifiers (PAs), with each power amplifier being configured to serve a specific communication standard. However, such solutions are complex and expensive. The continued development of transmitter devices capable of implementing multiple high-PARP standards raises numerous non-trivial challenges.

BRIEF DESCRIPTION OF THE DRAWINGS

These and other features and advantages will be better understood by reading the following detailed description, taken together with the drawings wherein.

DETAILED DESCRIPTION

Figure 1:
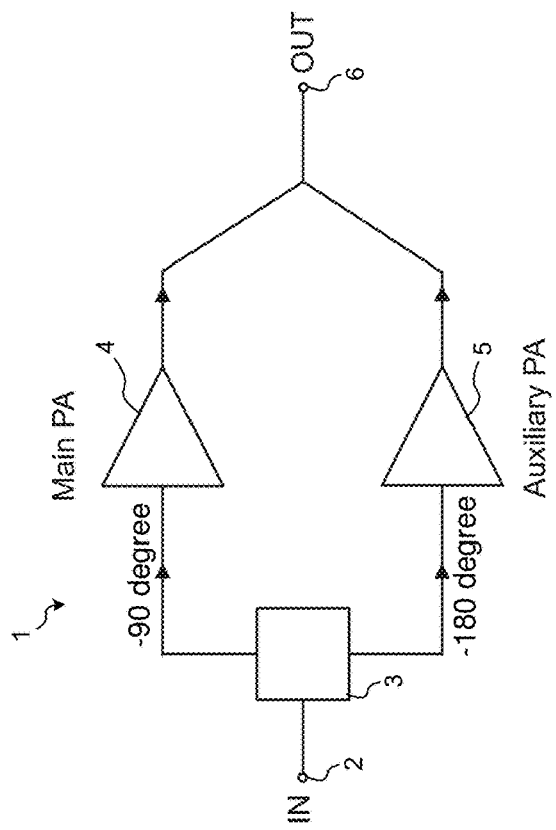
FIG. 1 shows an example Doherty amplifier architecture including a main power amplifier (PA) and auxiliary PA.

As discussed above, the continued development of transmitter devices capable of implementing multiple high-PARP standards raise numerous non-trivial challenges. Some approaches have been proposed, but each involves tradeoffs including complexity, efficiency, and an inability to accommodate future high-PARP standards. For instance, FIG. 1 shows one example Doherty amplifier architecture 1 including an input stage 2, quadrature generator 3, a main PA 4, an auxiliary PA 5, and an output 6. Moving from left to right in FIG. 1, the quadrature generator 3 produces two outputs that are 90 degrees out of phase with each other. The main PA 4 operates in class B and auxiliary PA 5 operates in class C. In operation, biasing is done in such a way that only the main PA 4 is active when an input signal amplitude is less than half the peak amplitude. Thus, in this case, the system acts as a conventional class B amplifier, or push-pull amplifier, providing peak drain efficiency of 78.5%. When the signal amplitude increases beyond 50% peak amplitude, the auxiliary PA 5 comes becomes operational, e.g., switched ON, with the main PA 4 continuing to operate at full efficiency. This arrangement helps in improving average efficiency of high PAPR signals while increasing the linear range by approximately 6 dB. However, one drawback of this approach is that the transmission lines used in Doherty PAs introduce losses. In addition, switching of the auxiliary PA 5 on/off introduces adjacent-channel-power-ratio (ACPR) issues.

Figure 2:
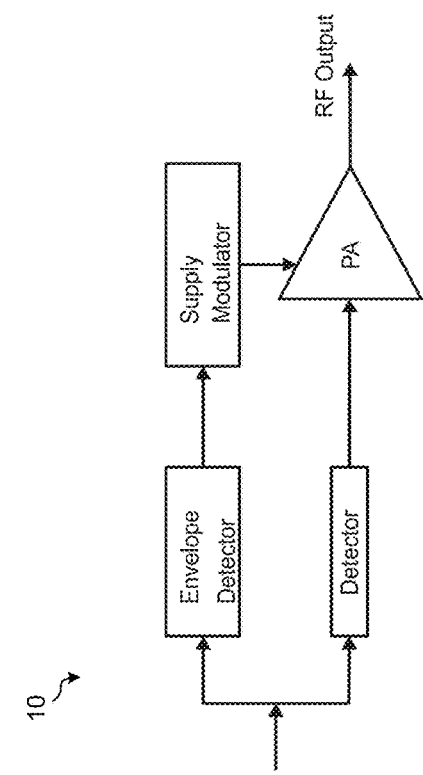
FIG. 2 shows a radio frequency (RF) PA architecture using a polar modulation technique.

Another approach to RF PA architecture includes using polar modulation, such as shown FIG. 2. The basic idea in polar modulation technique, also known as Envelope Elimination and Restoration, is to separate the amplitude and phase paths while performing amplification. This enables the use of high-efficiency constant amplitude PAs to amplify the phase path, while some form of envelope detection and modulation is sought to implement an overall linear PA.

Switched mode PAs are particularly well suited for use as RFPAs when implementing a polar modulation scheme. In this context, a narrowband RF modulated signal can be represented by the following equation:

$$V_{in}(t) = A_{env}(t)\cos(\omega_o t + \varphi(t)) \quad \text{Equation (1)}$$

, where $A_{env}(t)$ and $\varphi(t)$ represent amplitude and phase respectively. As observed from Equation (1), polar modulation thus includes mixing the amplified versions of envelope signal $A_{env}(t)$ and the RF phase signal $\cos(\omega_o t + \varphi(t))$. While theoretically straight forward, in practice such mixing raises numerous challenges at RF. One approach of implementation is to use an envelope detector capable of working at RF to perform drain modulation of the nonlinear RFPA. One of the main issues in implementation of polar modulation is the amplitude-phase path mismatch. For instance, a delay mismatch of 40 ns allows only 5 dB of margin between the output spectrum and the required spectral mask. Another challenge is with regard to bandwidth expansion of $A_{env}(t)$ and $\cos(\omega_o t + \varphi(t))$.

Figure 3:
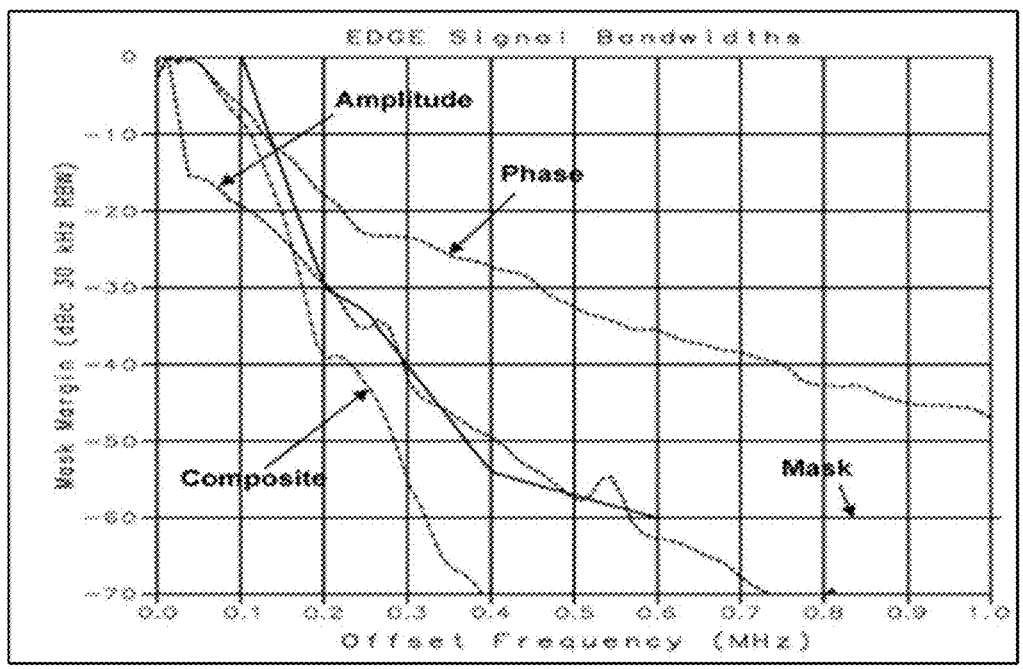
FIG. 3 shows a graph illustrating the amplitude and phase signals for an Enhanced Data rates for GSM Evolution (EDGE) system relative to a target spectral mask.

For example, as seen in FIG. 3, the amplitude and phase signals for an Enhanced Data rates for GSM Evolution (EDGE) system occupy much broader bandwidths than the spectral mask. This implies that the blocks used in the amplitude and phase paths should accommodate for this increased bandwidth. Failure to do so may unfortunately result in loss of linearity giving rise to spectral regrowth.

Figure 4:
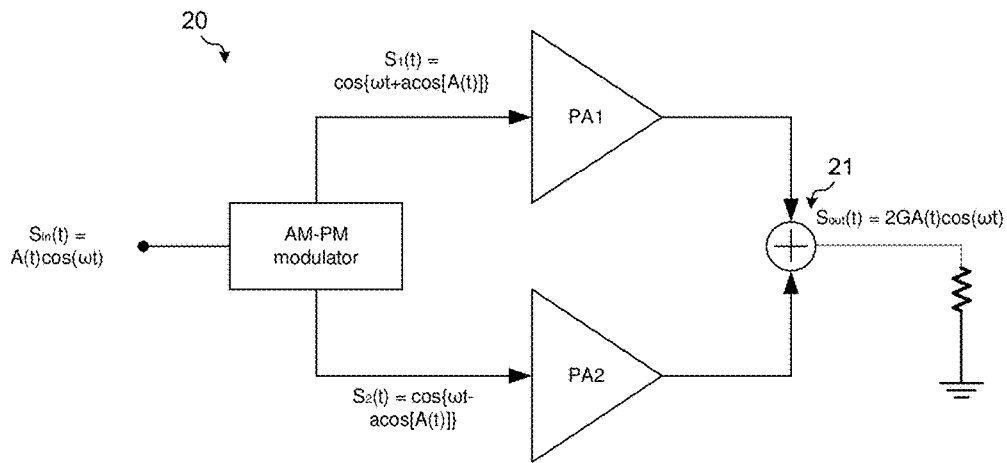
FIG. 4 shows an example approach for performing outphasing of an RF signal.

Another approach to RF PA architecture includes using a so-called "out-phasing" technique. One example circuit 20 for performing out-phasing of an RF signal is shown in FIG. 4. In brief, out-phasing includes embedding amplitude information in the phase itself. As shown, a narrowband RF modulated signal $S_{in}(t) = A(t)\cos(\omega t)$ is split into two constant amplitude signals $S_1(t)$ and $S_2(t)$ by means of an AM-PM modulator. Since $S_1(t)$ and $S_2(t)$ are constant amplitude, they can be amplified by highly efficient non-linear RFPAs, e.g., PA1 and PA2. Addition of amplified versions of $S_1(t)$ and $S_2(t)$ yields back an amplified version of $S_{in}(t)$.

In a mathematical sense, the out-phasing scheme appears to be particularly well suited for RF by utilizing the high efficiency of switched mode PAs while yielding a linear output. But, as with many other schemes that appear to mathematically hold promise, this too comes with its fair share of implementation issues. Of concern is the implementation of low loss power combiner block 21. Some approaches have been proposed for implementing the combiner block 21 including a matched combiner with isolation to achieve good linearity. But, efficiency drops drastically due to power being wasted in the isolation resistor. The average efficiency of high PAPR signals is quite low because the individual PAs continue to operate at a constant power even if the output signal power is low. Another approach includes a Chireix non-isolating lossless power combiner using an active load modulation technique to achieve enhanced efficiency. However, this solution introduces non-linearities at the output. Another approach includes a transformer-based combiner. However, such combiners introduce 1 or 2 dB of intrinsic loss.

Another major concern in RFPA architecture is with respect to generation of outphased signals to drive the RFPAs. The outphased signals can be represented as:

$$S_1(t) = \cos\{\omega_c(t) + \varphi(t) + \arccos[A(t)]\} \quad \text{Equation (2)}$$

$$S_2(t) = \cos\{\omega_c(t) + \varphi(t) - \arccos[A(t)]\} \quad \text{Equation (3)}$$

Generating $S_1(t)$ and $S_2(t)$ as seen in the above equations involves phase modulation at RF frequencies which is a complex task. The phase is modulated by $\pm\arccos[A(t)]$ is a nonlinear function of $A(t)$, thereby making it harder to implement. Some approaches to nonlinear frequency translating feedback loops have been proposed, but the proposed approaches come with tradeoffs such as stability issues which limit their feasibility. Also, digital outphasing modulators have been proposed. The main advantage of such implementations is that they are poised to benefit from scaling of digital circuits. However, phase locked loops and phase rotators are primary components of these implementations making it difficult for such devices to achieve re-configurability in the frequency domain.

Thus, in accordance with an embodiment of the present disclosure, a multi-standard transmitter architecture with digitally upconverted IF outphased signals is disclosed that allows for reconfiguration in the frequency domain along with a peak drain efficiency of at least 85% while delivering output power of, for instance, 10 W at 1 GHz frequency. In more detail, the approach disclosed herein includes obtaining outphased signals $S_1(t)$ and $S_2(t)$, e.g., see Equations (2) and (3) above, using digital components that may be easily reconfigurable in frequency domain. This implementation advantageously allows a transmitter configured in accordance with embodiments herein to accommodate multiple RF standards along with leveraging the benefits accrued from technology node scaling.

In accordance with another embodiment, an output stage is disclosed that is implemented with non-complementary GaN-type transistor devices. The output stage may include a so-called "on-chip" driver circuit and switched mode amplifier circuit with an inverse Class-D configuration. The output stage may therefore benefit from having the driver circuitry on the same chip as the amplification circuitry, which yields increased performance and efficiency. However, this disclosure is not necessarily limited in this regard and the driver circuitry and amplifier circuitry may be implemented on different chips. In any event, the driver circuitry may include a two-stage design whereby a first stage is configured to generate a driving signal having a voltage swing sufficient to drive transistor devices of the amplifier circuitry, and a second stage of the driver circuitry may include an inverter circuit or other logic to then drive the amplifier circuit based on the driving signal.

Transmitter devices configured in accordance with embodiments and aspects of the present disclosure present numerous advantages over other approaches. For example, a transmitter consistent with embodiments herein may be easily reconfigured in the frequency domain to accommodate N number of RF standards. Some such example standards include the 802.11x IEEE standards for wireless networking. While examples and embodiments herein discuss 802.11x standards specifically, this disclosure should not be limited in this regard. The present disclosure is equally applicable to other RF standards and particularly those that include high-PARP. In addition, a transmitter configured in accordance with the present disclosure can operate at a relatively high drain efficiency of substantially 85% while outputting at 10 W at a frequency of 1 Ghz, for example.

Example Power Transmitter Architecture and Methodology

Figure 5:
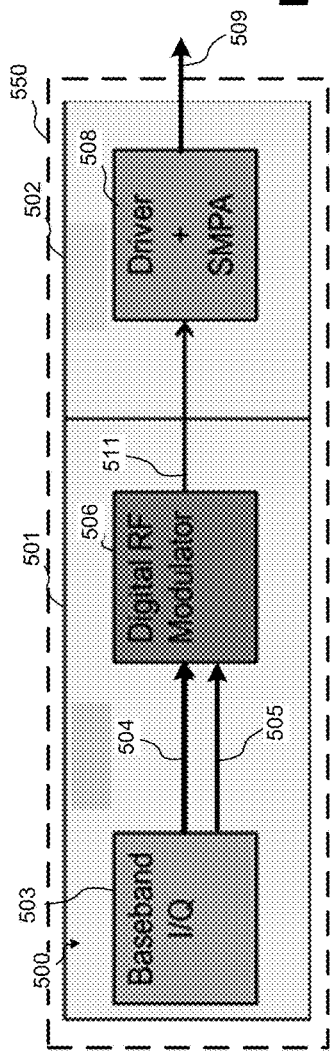
FIG. 5 shows an example RF transmitter architecture in accordance with embodiments of the present disclosure.

Turning to FIG. 5, a block diagram illustrates an example power amplifier radio frequency (PARF) transmitter architecture 500 in accordance with an embodiment of the present disclosure. As shown, the transmitter architecture 500 includes an upconversion stage 501 for providing a digitized, up-converted RF signal to an output stage 502. The upconversion stage 501 may comprise a complementary metal-oxide semiconductor (CMOS) application-specific integrated circuit (ASIC) to digitally upconvert a baseband signal to RF. The output stage 502 may comprise, for example, a power amplifier (PA) implemented as a Gallium Nitride (GaN) integrated circuit (IC). GaN is particularly well suited for use in switch-mode PA circuits due to the Johnson Figure of Merit $f_T^* V_{BK}$ (transition frequency times breakdown voltage) which enables fast switching speeds and a large breakdown. However, this disclosure is not necessarily limited in this regard and the output stage 502 may comprise, for example, a PA implemented in Gallium Arsenide or any other suitable Gallium-based material.

The transmitter architecture 500 may be implemented in an RF transmitter device 550, such as a wireless router implementing a 802.11x standard.

The upconversion stage 501 may include a baseband I/Q modulator circuit 503 for producing waveform signals 505 and 505, with signals 504 and 505 representing an "in-phase" component "I" of the waveform and the quadrature "Q" component, respectively. As discussed in more detail below, the baseband I/Q 503, which may also be referred to as an IF processor, digitally outphases two sets of digital quadrature signals at intermediate frequency (IF), such as shown in greater detail in FIG. 6A. The digital RF modulator 506, which may also be referred to as a digital upconverter circuit, receives the two sets of digital outphased quadrature signals and then upconverts the same to produce an output signal 511 using a multiplexer-based digital upconverter approach. One example multiplexer-based digital upconversion process suitable for use in the transmitter architecture 500 is discussed in greater detail below. The digitally up-converted outphased IF signal 511, which may also be referred to as an output RF signal, may then be applied to an input of the GaN PA circuit 508. The GaN PA circuit 508 may then output an amplified output RF signal 509 via, for example, an antenna 618 (See FIG. 6A). The RF signal 509 may be passed through one or more filtering stages, e.g., band pass filters 613/614 prior to transmission to remove unwanted frequency components.

Figure 6A:
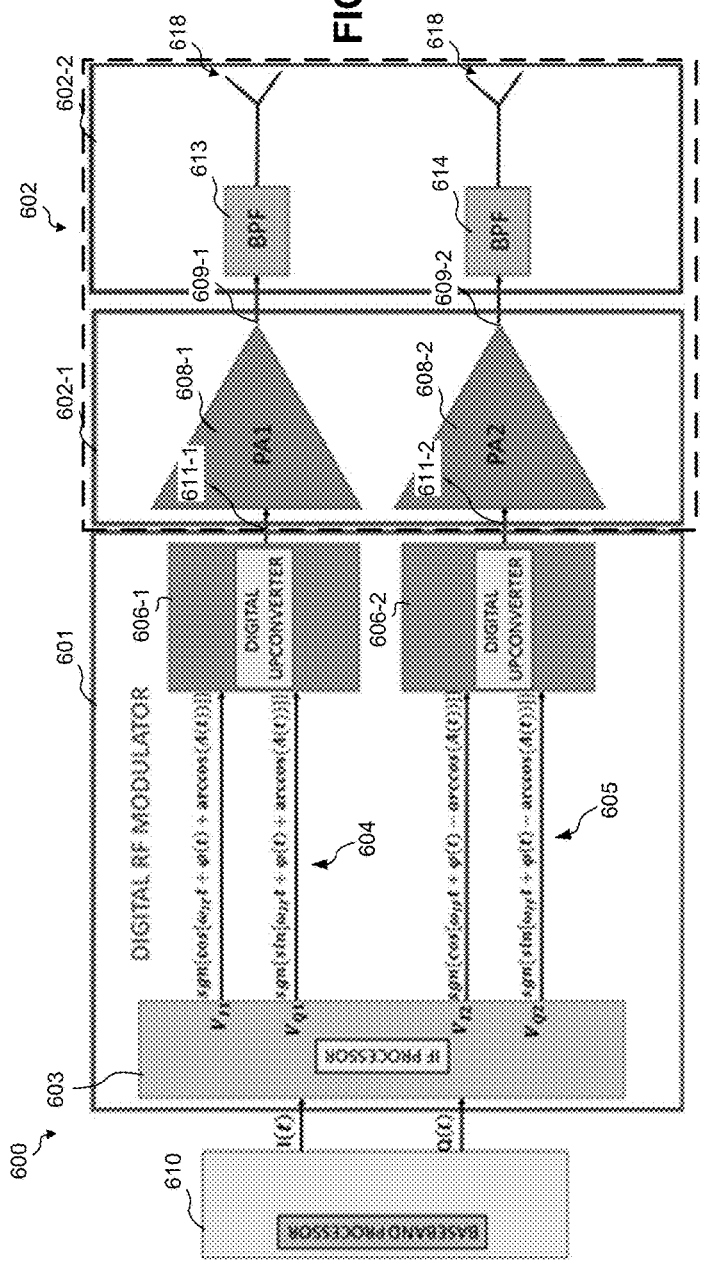
FIG. 6A shows another schematic view of the example RF transmitter architecture of FIG. 5 in further detail in accordance with an aspect of the present disclosure.

Turning to FIG. 6A, an example transmitter architecture 600 is shown in accordance with aspects of the present disclosure. As shown, the example transmitter architecture 600 includes an upconverter stage 601 coupled to an output stage collectively shown at 602 and individually shown as PA stage 602-1 and antenna driving stage 602-2.

As shown, a baseband processor 610 outputs signals I(t) and Q(t) respectively. The baseband IQ 603, which may also be referred to as an IF processor, receives signals I(t) and Q(t) respectively. The IF processor 603 then outputs two sets of digital quadrature outphased signals at IF. The digital quadrature outphased signals may be represented by the following equations:

$$V_{I1}(t) = \text{sgn}\{\cos[\omega_{IF}t + \varphi(t) + \arccos(A(t))]\} \quad \text{Equation (4)}$$

$$V_{Q1}(t) = \text{sgn}\{\sin[\omega_{IF}t + \varphi(t) + \arccos(A(t))]\} \quad \text{Equation (5)}$$

$$V_{I2}(t) = \text{sgn}\{\cos[\omega_{IF}t + \varphi(t) - \arccos(A(t))]\} \quad \text{Equation (6)}$$

$$V_{Q2}(t) = \text{sgn}\{\sin[\omega_{IF}t + \varphi(t) - \arccos(A(t))]\} \quad \text{Equation (7)}$$

$$\text{where, sgn}(x) = \begin{cases} -1, & x < 0, \\ 0, & x = 0, \\ 1, & x > 0. \end{cases}$$

Figure 6B:
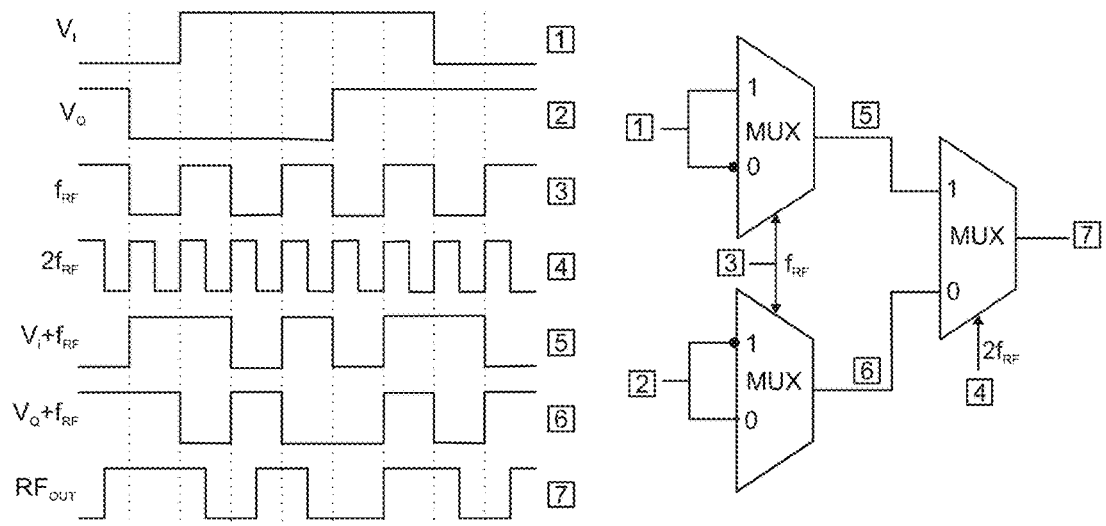
FIG. 6B shows an example timing diagram and digital logic for performing MUX-based digital upconverting of outphased IF signals, in accordance with an embodiment of the present disclosure.

Digital upconverter circuitry 606-1, 606-2, may then receive the outphased IF signals 604, 605 respectively. The digital upconverter circuitry 606-1, 606-2 may then each upconvert their respective IF signals using a MUX-based digital upconversion process. For example, FIG. 6B shows an example digital logic and a timing diagram during upconversion of signals $V_I$ and $V_Q$. As shown, the inphase signal $V_I$ and quadrature signal $V_Q$ are each muxed with $f_{RF}$ with the output of each (indicated as 5, 6) being muxed together with signal $2f_{RF}$ to produce the RFout signal indicated at 7. The RFout signal may be utilized, at least in part, to drive a PA stage, which is discussed in greater detail below.

In an embodiment, the digital upconverter circuitry 606-1, 606-2 operates similar to a digital mixer using multiple frequencies, e.g., $2f_{RF}$ and $f_{RF}$ to produce signals (e.g., RFout) at a desired frequency. In this embodiment, the clock signals $f_{RF}$ and $2f_{RF}$ may be generated from a programmable hardware clock such as a fractional N, Phased locked Loop (PLL) (not shown) that can generate RF frequencies ($2f_{RF}$) between about 850 MHz and 5.8 GHz (which generally encompass standards including 3G, 4G, 802.11), for example. To this end, the digital upconverter circuitry 606-1, 606-2 may be dynamically/programmatically adjusted, e.g., via firmware/software changes during operation, via adjustment of clock rates of the clock source to output at different frequencies depending on the desired application. Other output frequencies are also within the scope of this disclosure and the provided examples are not intended to be limiting.

Figure 6C:
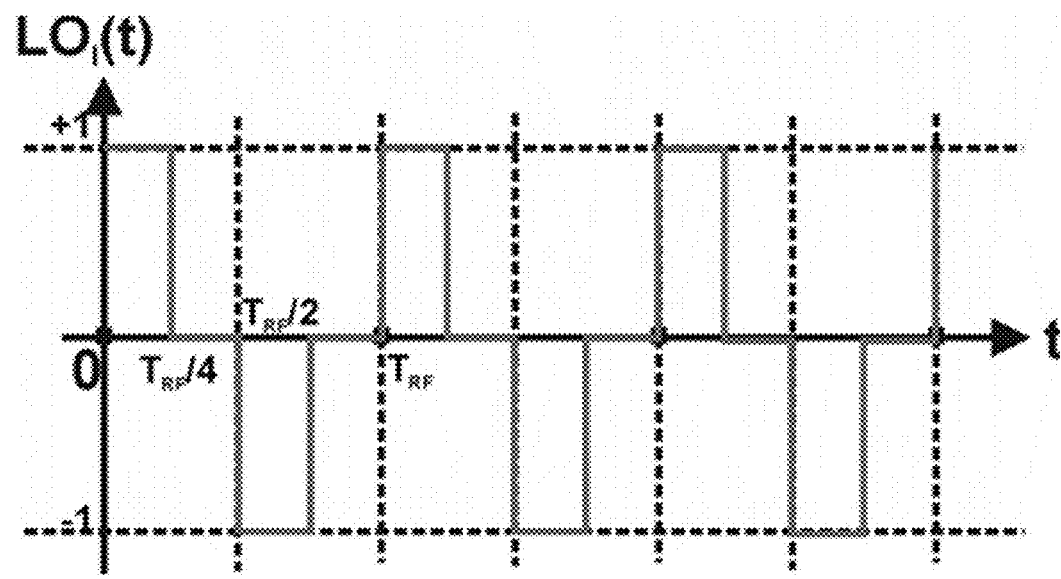
FIGS. 6C-6D each show an example multi-level digital clock signal suitable for use in performing MUX-based digital upconverting of outphased IF signals, in accordance with an embodiment of the present disclosure.

As shown, the MUX-based digital upconversion logic shown in FIG. 6B is equivalent to multiplying $V_I$ and $V_Q$ with respective three-level clock signals $LO_I(t)$ and $LO_Q(t)$, although other multi-level clock signals may be utilized and are within the scope of this disclosure. For example, FIG. 6C shows a timing diagram for in-phase $LO_I(t)$, which includes three distinct digital signal levels −1V, 0V and +1V. $LO_I(t)$ may be expressed by the following equation:

$$LO_I(t) = \frac{2}{\pi} \sum_{k=0}^{\infty} \frac{\sin(2k+1)\omega_{RF}t}{2k+1} \quad \text{Equation (8)}$$

As shown in Equation (8), the signal $LO_I(t)$ contains harmonics at odd multiples of the carrier $\omega_{RF}$ decreasing with the harmonic number.

Figure 6D:
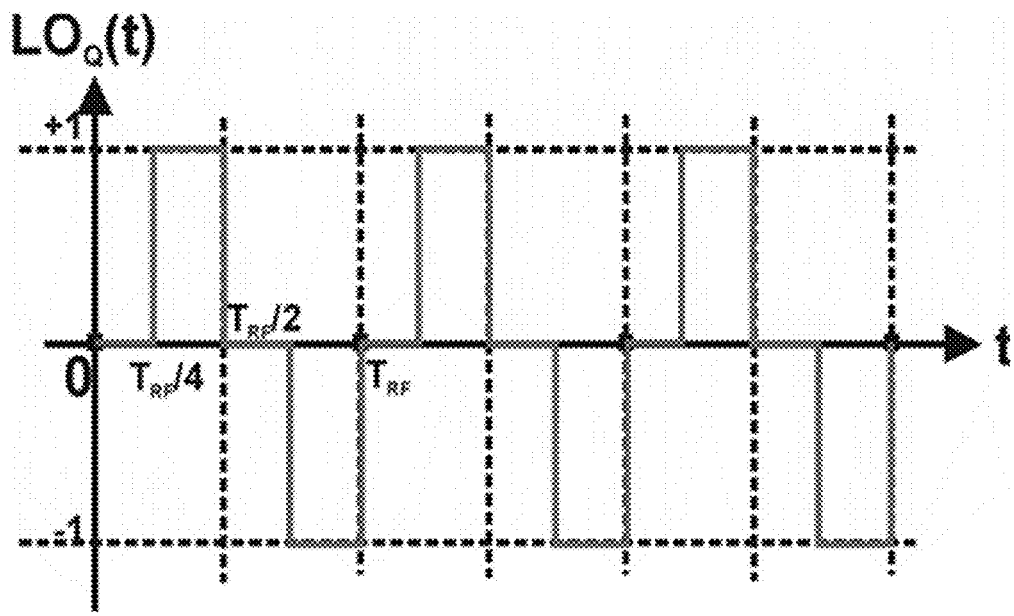

FIG. 6D shows a timing diagram for $LO_Q(t)$, which includes three distinct digital signal levels −1V, 0V and +1V. The signal $LO_Q(t)$ is related to $LO_I(t)$ as $LO_Q(t)=LO_I(t-T_{RF}/4)$ and the outphased signals can be represented by the following equations:

$$V_{I1} = \text{sgn}\{\cos[\theta(t)]\} = -\frac{4}{\pi} \sum_{k=0}^{\infty} (-1)^k \frac{\cos[(2k+1)\theta(t)]}{2k+1} \quad \text{Equation (9)}$$

where $\theta(t) = \omega_{IF}t + \varphi(t) + \arccos[A(t)]$ $$V_{Q1} = \text{sgn}\{\sin[\theta(t)]\} = \frac{4}{\pi} \sum_{k=0}^{\infty} \frac{\sin[(2k+1)\theta(t)]}{2k+1} \quad \text{Equation (10)}$$

Therefore, the process of quadrature MUX-based digital upconversion is equivalent to the following mathematical formula:

$$y_1(t) = V_I \times LO_I(t) + V_Q \times LO_Q(t) = \left(-\frac{8}{\pi^2}\right)$$ Equation (11)

$$\left\{\sin[\theta(t) + \omega_{RF}t] + \cos[\theta(t)]\sum_{k=1}^{\infty}\frac{\sin[(2k+1)\omega_{RF}t]}{2k+1} + \right.$$

$$\sin[\theta(t)]\sum_{k=1}^{\infty}(-1)^k\frac{\cos[(2k+1)\theta(t)]}{2k+1} +$$

$$\cos[\omega_{RF}t]\sum_{k=0}^{\infty}\frac{\sin[(2k+1)\theta(t)]}{2k+1} +$$

$$\sin[\omega_{RF}t]\sum_{k=1}^{\infty}(-1)^k\frac{\cos[(2k+1)\theta(t)]}{2k+1} +$$

$$\sum_{k=1}^{\infty}(-1)^k\frac{\cos[(2k+1)\theta(t)]}{2k+1} \times$$

$$\sum_{k=1}^{\infty}(-1)^k\frac{\cos(2k+1)\omega_{RF}t}{2k+1} +$$

$$\sum_{k=1}^{\infty}\frac{\sin[(2k+1)\theta(t)]}{2k+1} \times$$

$$\left.\sum_{k=1}^{\infty}(-1)^k\frac{\cos(2k+1)\omega_{RF}t}{2k+1}\right\}$$

The digitally upconverted outphased IF signals 611-1, 611-2 (or $RF_{out}$ signals) are then applied to the input of PAs 608-1, 608-2, respectively, as shown in FIG. 6A. Each of PAs 608-1, 608-2 may then output amplified $RF_{out}$ signals 609-1, 609-2 respectively. As shown in Equation (11) above, the first term in $y_1(t)$ resembles the constant amplitude signal $S_1(t)$ discussed above with regard to FIG. 4. However, signal $y_1(t)$ may include unwanted frequency components when compared to $S_1(t)$ and risks violating linearity specifications. Thus, the transmitter architecture 600 may include a filtering stage to remove unwanted frequency components from the RF output signals 609-1, 609-2. The filtering stage may include one or more filters, such as bandpass filters 613, 614 of the antenna driving stage 602-2. Assuming linear amplification and bandpass filtering, the output signal 609-1 of first PA 608-1 filtered by filter 613 may be derived based on the following equation:

$$z_1(t) = BPF[y_1(t)]$$ Equation (12)

$$= G\left(-\frac{8}{\pi^2}\right)\sin[\theta(t) + \omega_{RF}t]$$

$$= G\left(-\frac{8}{\pi^2}\right)\sin[\omega_{IF}t + \varphi(t) + \arccos(A(t)) + \omega_{RF}t]$$

where G is equal to the gain of the first PA 608-1.

Continuing on, and to follow a similar chain of operation for the second PA 608-2 with the other set of outphased signals, the output signal 609-2 may be derived based on the following equation $$z_2(t) = G\left(-\frac{8}{\pi^2}\right)\sin[\omega_{IF}t + \varphi(t) + \arccos(A(t)) + \omega_{RF}t]$$ Equation (13)

where G is equal to the gain of the second PA 608-2.

Using ideal summation in space, the final output signal (e.g., as transmitted via antenna 618) may be derived from the following equation:

$$z(t) = z_1(t) + z_2(t) = G\left(-\frac{8}{\pi^2}\right)A(t)\sin[\omega_{IF}t + \varphi(t) + \omega_{RF}t]$$ Equation (14)

Thus, as demonstrated in the equation above, the amplitude information may be derived by summing the outphased signals in a linear fashion.

In an embodiment, the upconverter stage 601 (including the IF processor 603 and digital upconverter circuitry, e.g., upconvert circuitry 606-1, 606-2) is implemented via a 65 nanometer (nm) CMOS process, although other processes are within the scope of this disclosure. Each of the PAs 608-1, 608-2 may be implemented in GaN, and thus may be implemented in a chip separate from the upconverter stage 601. A 50 ohm terminated transmission line (shown generally at 611-1, 611-2 of FIG. 6A) may electrically couple the upconvert stage 601 with the output stage 602. The 50 ohm transmission line advantagesouly isolates the high input capacitance of each PA from the CMOS circuit. Each of the bandpass filters 613, 614 may be implemented in a separate, e.g., in a so-called "off-chip" configuration, from that of the chip of the PA stage 602-1.

The prior discussion assumed a block shaped nature for the bandpass filters 613, 614 which recovers frequency components centered at $[\omega_{IF}t+\varphi(t)+\arccos(A(t))+\omega_{RF}t]$ and $[\omega_{IF}t+\varphi(t)-\arccos(A(t))+\omega_{RF}t]$. No such filters exist in reality. Therefore, a simulation based on and validated using Equations (4)-(14) may demonstrate the system-level linearity of the transmitter architecture 600 using characteristics of a desired signal standard, e.g., 802.11x. The simulation may be utilized to provide an output spectrum that can be subjected to a spectral mask check. Once the spectral mask is determined and subjected to the spectral mask check, each PA and associated filter may be designed accordingly to meet the spectral mask linearity check.

Figure 7:
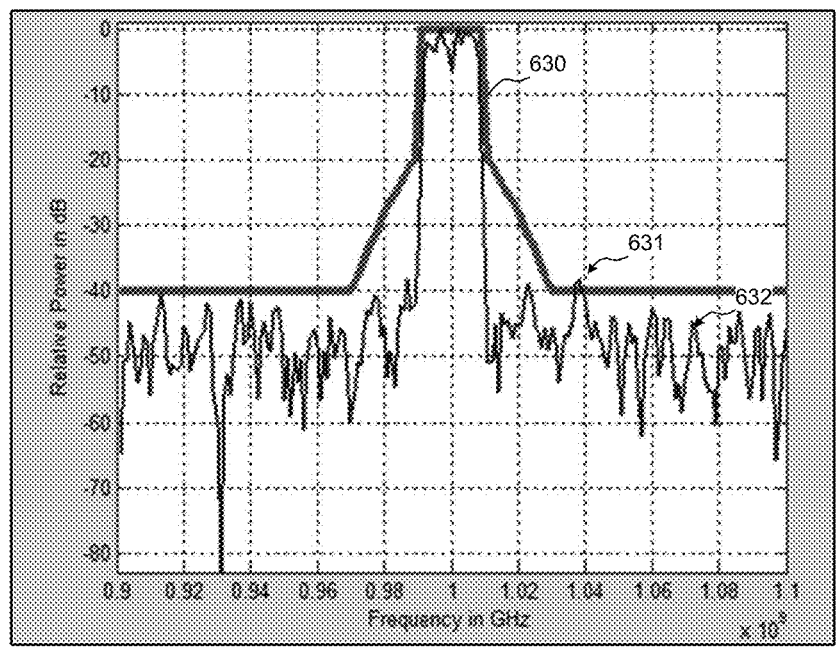
FIG. 7 shows a graph that depicts the output spectrum of a simulated 802.11a signal relative to a spectral mask after performing a MUX-based digital upconvert process consistent with aspects of the present disclosure.

FIG. 7, with additional reference to FIG. 6A, shows a simulation result for one such simulation and the corresponding spectrum of the output signal subjected to a spectral mask check. The simulation fo FIG. 7 was performed using Cadence Virtuouso 6.1.7, although other design suites may be utilized to perform similar validation. In any event, and as shown in FIG. 7, the baseband processor 610 was used to drive the upconvert stage 601 using the 802.11a standard. The 802.11a standard standard exhibits a relatively high PAPR of 7.3 dB and bandwidth of 20 MHz. The IF processor 603 was implemented in Verilog-A to yield a set of digital quadrature outphased signals 604, 605 having voltage levels of −1 and 1 with realistic rise/fall times of 30 picoseconds (ps). The three level clock signals $LO_Q(t)$ and $LO_I(t)$ were implemented by superimposing pulses from an analog simulation library (e.g., vpulses from analogLib) on top of each other with a 90 degree phase difference. Realistic rise/fall times of 30 ps are attributed to the superimposed pulses. The IF frequency was chosen to be 200 MHz, and accordingly, the three-level RF clock frequency comes out to be 800 MHz.

As shown in the spectral graph of FIG. 7, there is a minor violation 631 of the spectral mask 630 near 1.04 GHz frequency by the output spectrum 632. However, the remaining portion of the spectrum 632 comports with the spectral mask 630. As discussed in further detail below, filtering, such as bandpass filtering, may ensure the spectrum comports with a target mask. Thus, as shown in FIG. 7, the Equations (4)-(14) disclosed above demonstrate that the transmit architecture 600 is capable of using a MUX-based digital conversion process to provide an output signal that comports with system-level linearity requirements.

Output Stage Architecture and Methodology

Figure 8A:
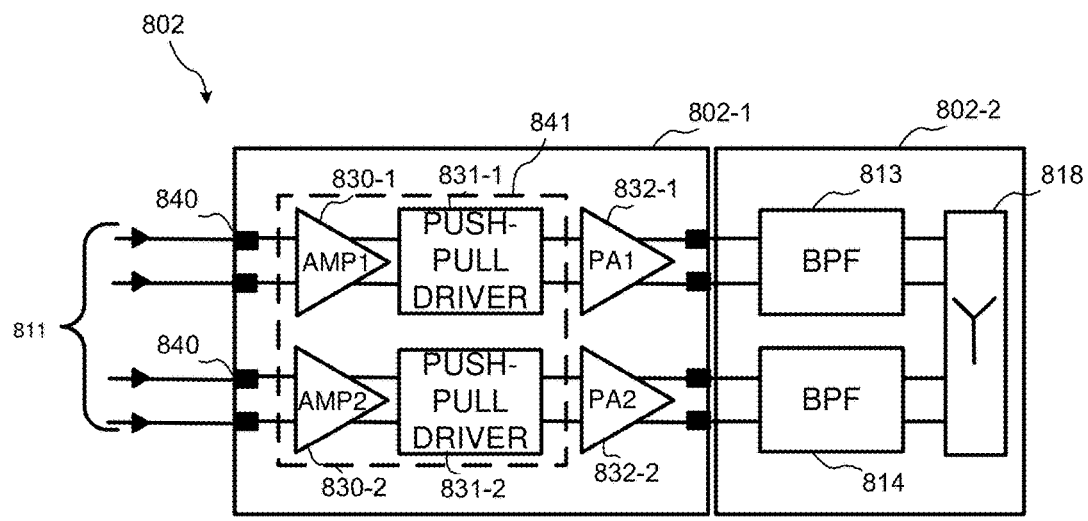
FIG. 8A shows an example system diagram of an output stage and an antenna driving stage suitable for use in the RF transmitter architecture of FIG. 6A, in accordance with an embodiment of the present disclosure.
Figure 8B:
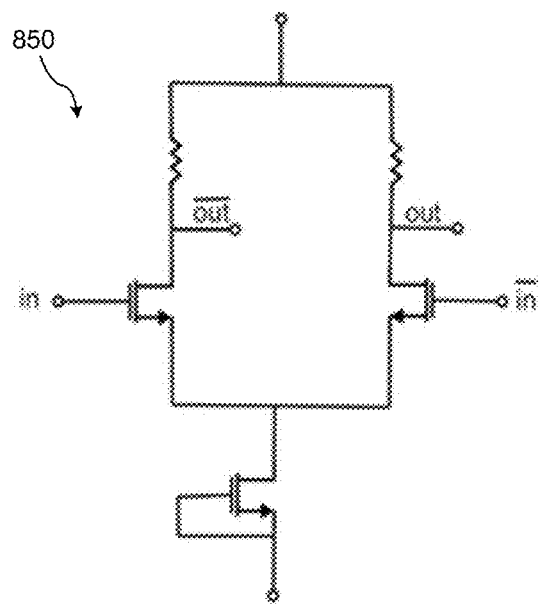
FIG. 8B is a circuit diagram of an example differential amplifier circuit suitable for use in the output stage of FIG. 8A.

Turning to FIG. 8A, a block diagram illustrates an example output stage 802 with a PA stage 802-1 and an antenna driving stage 802-2. The output stage 802 is suitable for use in the transmitter architecture 501/601 of FIGS. 5 and 6, respectively. In an embodiment, the PA stage 802-1 includes the two-stage driving circuit 841, with the two-stage driving circuit 841 comprising a differential amplifier stage, e.g., first and second amplifiers 830-1, 830-2, followed by a push-pull inverter stage, e.g., first and second push-pull inverters 831-1, 831-2. The two-stage driving circuit 841 may then output to a PA circuit, with the PA circuit comprising first and second PAs 832-1, 832-2. The first and second PAs 832-1, 832-2 may comprise a switched mode power amplifier (SMPA) implemented with an inverse class D configuration, although other PA architectures are within the scope of this disclosure. The PAs 832-1, 832-2 may also be referred to as modified Current Mode Class-D (CMCD) amplifiers. The PA stage 802-1 may be formed using GaN alone or in combination with other suitable materials. The antenna driving stage 802-2 may include filters 813 and 814, e.g., band pass filters (BPFs), and antenna 818.

In more detail, transmission lines 811 receive the $RF_{out}$ signals, e.g., digitally upconverted outphased signals 611-1, 611-2 from the upconvert stage 601. An input of each of the first and second amplifiers 830-1, 830-2 couple to the signals 611-1, 611-2 respectively. The first and second amplifiers 830-1, 830-2 may comprise a differential amplifier designed to provide a 0 to $V_{DD}$ swing sufficient to allow the first and second push-pull drivers 831-1, 831-2 to drive switches of the PAs 832-1, 832-2. For example, as previously discussed, the digital upconvert stage may be formed via a 65 nm CMOS process which supports supply voltage of 1.2V. In this example, the transmission lines 811 may comprise 50 ohm terminated transmission lines. Accordingly, the maximum input swing obtained at the interface provided by pads 840 is 600 $mV_{pp}$. However, and as discussed further below, the PAs 832-1, 832-2 may require an input swing of about 4V, although other input swings may be necessary depending on the transistors used to form the PAs. Therefore, the first and second amplifiers 830-1, 830-2 may provide a pre-driver amplification to bring the input swing to about 4V to allow the push-pull drivers 831-1, 831-2 to drive their associated PAs. One such example differential amplifier circuit 850 suitable for use in the output stage 802 shown in FIG. 8A. Notably, differential amplifiers also advantageously reject common mode noise introduced by passive networks, e.g., printed circuit board and/or chip-to-chip interconnections.

As discussed in further detail below, the push-pull inverters/drivers 831-1, 831-2 may be configured to drive the PAs based on the digitally upconverted outphased signals 611-1, 611-2. To better understand the technical aspects and operation of the push-pull inverters/drivers 831-1, 831-2, this disclosure will first discuss technical aspects and operation of PAs 832-1, 832-2. As previously discussed, the first and second PAs 832-1, 832-2 may be implemented as inverse class D PAs, although other PA architectures are within the scope of this disclosure.

Figure 9A:
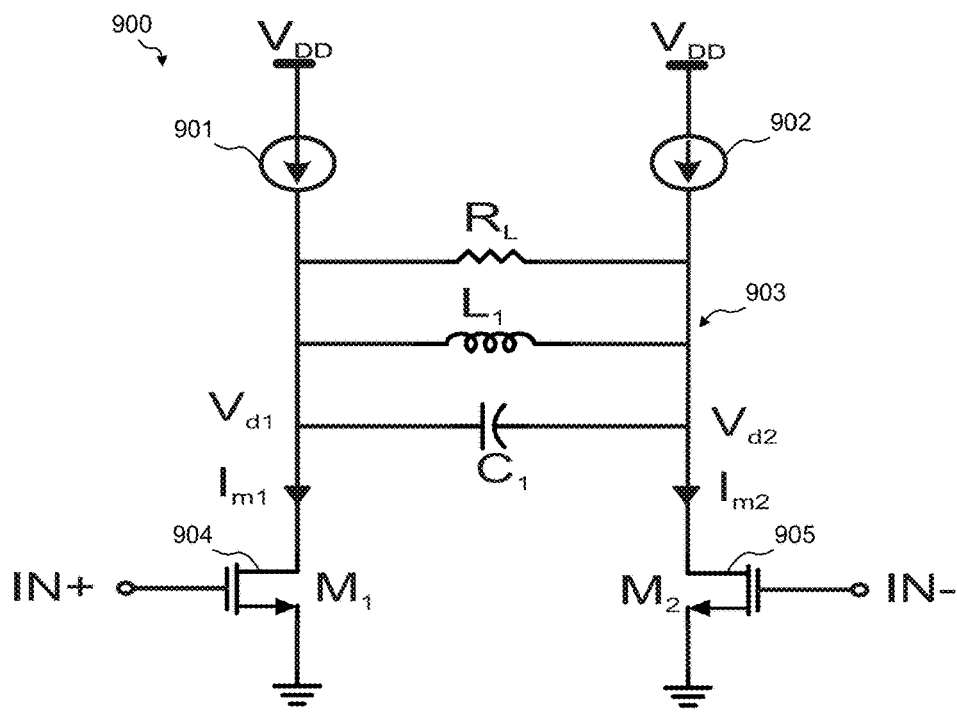
FIG. 9A is a circuit diagram of an inverse Class-D amplifier circuit consistent with the present disclosure.

Inverse class D PAs are particularly well suited for the output stage 802. As the name suggests, inverse class D is the dual of class D. In this topology, the drain current waveform is square-shaped while the drain voltage waveform is half sinusoidal shaped. For example, and as shown in FIG. 9A, the class D topology 900 includes current sources 901, 902, switches 904 and 905, and a parallel-connected filter arrangement 903 coupled therebetween. The parallel-connected filter arrangement 903 may include a resonant frequency that is set to the carrier frequency, e.g., $f_{RF}$. The underlying idea of increasing efficiency using an inverse class D amplifier is by minimizing overlap between drain current and voltage waveforms, leading to theoretical attainment of 100% peak drain efficiency. The two switches 904, 905 shown in FIG. 9A are driven out of phase with respect to each other. The two switches 904, 905 may be implemented as, for instance, an NPN transistor or other suitable switching devices.

Figure 9B:
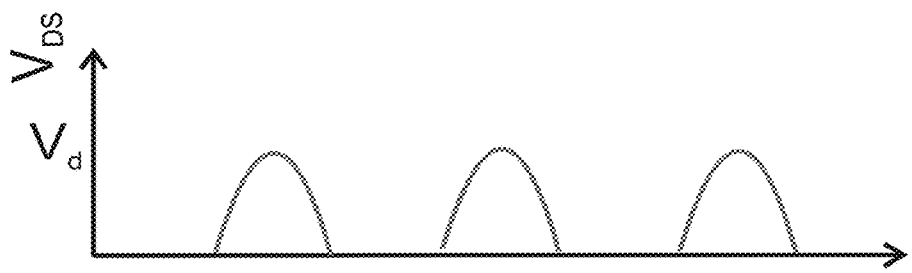
FIG. 9B is a timing diagram showing drain voltage relative to drain current over time (t) during operation of the amplifier circuit of FIG. 9A.
Figure 9B:
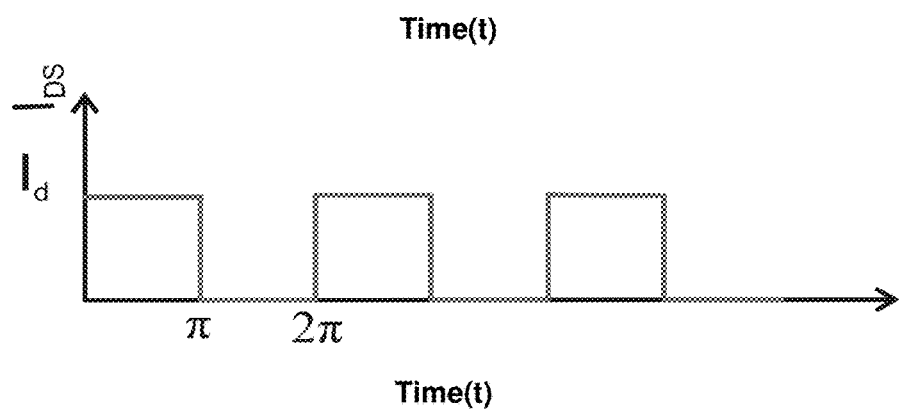

Turning to FIG. 9B, a timing diagram shows drain voltage and current waveforms during switching operations of the inverse class D amplifier of FIG. 9A. Switching ON a given one of the switches 904, 905 results in square shaped current appearing at the given switches drain with the drain node being pulled to ground (for an ideal switch), and since the other transistor is OFF there is no flow of current at its drain with the appearance of a half sinusoid resulting from the filtered current across the load. To understand this in a more detailed manner let us walk through the equations of drain currents and voltage waveforms respectively. The drains currents of switches 904, 905 represented by $I_{d1}$ and $I_{d2}$, respectively, can be written as, $$I_{d1}(\omega t) = I_{DC} - \frac{4}{\pi}I_{DC}\sum_{n=0}^{\infty}\frac{1}{2n+1}\sin[(2n+1)\omega t] \quad \text{(Equation 15)}$$

$$I_{d2}(\omega t) = I_{DC} + \frac{4}{\pi}I_{DC}\sum_{n=0}^{\infty}\frac{1}{2n+1}\sin[(2n+1)\omega t] \quad \text{(Equation 16)}$$

where $I_{DC}$ is the dc drain current and can be calculated as $I_{DC}=\hat{I}_d/2$, $\hat{I}_d$ being the drain current which flows through the transistor when it is turned ON.

Assuming that the resonator manages to short out all odd harmonics, we can write current through the load resistor R as:

$$I_R = -\frac{4}{\pi}I_{DC}\sin(\omega t) \quad \text{(Equation 17)}$$

The half sinusoidal drain voltages may be written as:

$$V_{d1}(\omega t) = \quad \text{(Equation 18)}$$
$$V_{DD} + \frac{\pi}{2}V_{DD}\sin(\omega t) - V_{DD}\sum_{n=1}^{\infty}\frac{2}{[(2n)^2-1]}\cos(2n\omega t)$$

$$V_{d2}(\omega t) = \quad \text{(Equation 19)}$$
$$V_{DD} - \frac{\pi}{2}V_{DD}\sin(\omega t) - V_{DD}\sum_{n=1}^{\infty}\frac{2}{[(2n)^2-1]}\cos(2n\omega t)$$

The differential voltage across therefore calculates to:

$$V_{d1}-V_{d2}=\pi V_{DD}\sin(\omega t) \quad \text{(Equation 20)}$$

The output power at fundamental frequency delivered to the load calculates to:

$$P_{out} = \frac{\pi^2 V_{DD}^2}{2R_L} \quad \text{(Equation 21)}$$

The total consumed DC power is, $$P_{DC} = V_{DD} \times 2I_{DC} = \frac{\pi^2 V_{DD}^2}{2R_L} \quad \text{(Equation 22)}$$

Based on Equations (21) and (22), drain efficiency can be calculated as, $$\eta_{DE} = \frac{P_{out}}{P_{DC}} \times 100 = 100\% \quad \text{(Equation 23)}$$

All the above equations have been derived for an ideal switch driven by 50% duty cycle waveform. In reality all transistors have finite on resistance along with parasitic capacitances which introduce losses. The tank circuit also has finite Q's which introduce losses driving down the efficiency from ideal 100%.

Figure 10:
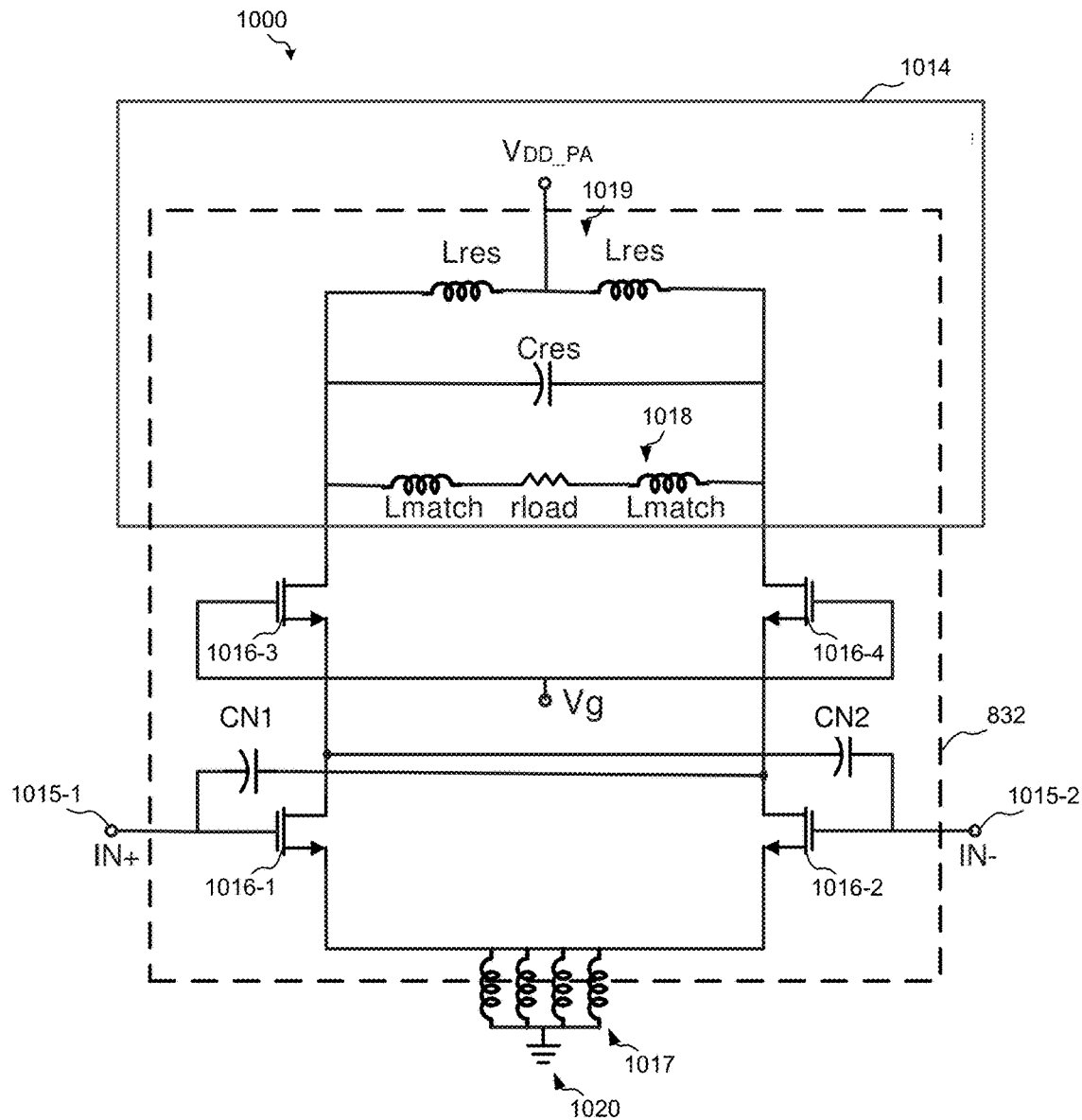
FIG. 10 shows a schematic view of an example inverse Class-D amplifier circuit, in accordance with an embodiment of the present disclosure.

Turning to FIG. 10, a circuit schematic 1000 shows an example inverse class D PA circuit 832 suitable for use as the first and/or second PA 832-1, 832-2. The inverse class D PA circuit 832 may be implemented using a Verilog-A based high voltage GaN high electron mobility transistor (HEMT) model. Transistors in accordance with this model have breakdown voltages as high as 50 V with a $f_t$ of up to 120 GHz. Such properties are particularly well suited for acheiving up to 80% peak drain efficiency for an output power of 10 W at a frequency of 1 GHz, for example. As shown, an antenna stage 1014 of the circuit 1000 may be implemented in an off-chip configuration, e.g., within the off-chip antenna driving stage 602-2 of FIG. 6A, although the present disclosure is not necessarily limited in this regard and the inverse class D PA circuit 832 may be implemented on the same chip.

As shown, the inverse D PA circuit 832 includes input terminals 1015-1, 1015-2 for interfacing with a push-pull driver, e.g., push-pull drivers 831-1, 832-1. Each of the input terminals 1015-1, 1015-2 electrically couples to a gate of the first and second switches 1016-1, 1016-2, respectively. The gate of the first switch 1016-1 may be electrically coupled in series with a drain of the second switch 1016-2 via a first neutralization capacitor CN1. Likewise, the gate of the second switch 1016-2 may be electrically coupled in series with a drain of the first switch 1016-1 via a second neutralization capacitor CN2. The first and second neutralization capacitors CN1, CN2 may be used at the inputs to increase the overall speed of operation by virtue of positive feedback and charge compensation.

An emitter of each of the first and second switches 1016-1, 1016-2 (which may be also referred to as lower switching devices) are coupled in series with each other, and couple to a plurality of inductors 1017 in parallel. The plurality of inductors 1017 may couple to ground. The plurality of inductors 1017 may comprise shunt lossy inductors, with the shunt lossy inductors being used to reduces the effective voltage drop across them thereby increasing efficiency.

In an embodiment, the transistors 1016-1 . . . 1016-4 form a cascode transistor topology. In this embodiment, the first and third transistors 1016-1, 1016-3 form a first cascode arrangement and the second and fourth transistors 1016-2, 1016-4 from a second cascode arrangement. The first and second switches 1016-1 and 1016-2 may be referred to as lower switches, and the third and fourth switches 1016-3, 1016-4 may be referred to as upper switches. In this embodiment, each of the first and second cascode transistor arrangements include an upper switching device for electrically coupling to a power supply and a lower switching device for receiving an input RF to provide an amplified RF signal across a load (rload) based on the input RF signal to drive the antenna stage, e.g., antenna stage 1014.

Cascode transistors generally include a common emitter stage feeding into a common base stage, e.g., the emitter of the third switch 1016-3 feeding into a drain of the first switch 1016-1, and the emitter of the fourth switch 1016-4 feeding into the drain of the second switch 1016-2. Cascode transistor arrangements advantageously increase circuit reliability and robustness by shielding the lower transistors from high drain voltages. Also, cascode transistors are more conducive towards obtaining higher powers by simply pulling up the supply voltage without substantially loading the lower transistors.

Although the switches 1016-1 . . . 1016-4 are shown as field-effect transistors (FETs), although transistor types are also within the scope of this disclosure. For instance, the switches 1016-1 . . . 1016-4 may comprise IGBT-type transistors.

One advantage of the cascode configuration stems from the placement of upper transistors as the load of the lower transistor's output terminal, e.g., the collector/drain. Because at high frequencies the upper transistors are effectively grounded by DC voltage source (Vg) the upper transistors' emitter/source voltage, and by extension the lower transistor's collector/drain, is held at a more constant voltage during operation. Stated differently, the upper transistors exhibit a low input resistance relative to their associated lower transistor. This results in a voltage gain seen at the collector/drain of an associated lower transistor being relatively small, which can reduce Miller feedback capacitance for the same. In any event, the upper transistors may be biased via Vg so as to keep associated lower transistors in saturation.

A drain of the third and fourth switches 1016-3, 1016-4, is is electrically coupled in parallel with an L-match network 1018. The load resistance, e.g., rload, of the L-match network 118 may be selected to match antenna resistance. In one specific example embodiment, the inverse class D PA circuit 832 is configured to output at 10 watts (W) of output power, although the PA circuit 832 output power may vary depending on a desired configuration. In an embodiment, the L-match network 1018 and L-res network 1019 are implemented on a printed circuit board (PCB) or other suitable substrate. In this embodiment, the inductors forming networks 1018 and 1019 may have better quality factors and larger values relative to inductors implemented on-chip, e.g., within the output stage 602/802.

Accordingly, the on-chip portions, e.g., output stage 602/802, in GaN or CMOS, for example, may generate different RF frequencies from a programmable clock source, e.g., a programmable PLL, and frequency limiting elements on a PCB. The inductors 1017 may operate as a common mode inductor, which may be formed from bonding wire inductors. The inductors 1017 may couple an external ground 1020 to an internal ground and may improve common-mode rejection. Preferably, the inductors 1017 are relatively small and may include a plurality of bonding wires coupled to external ground 1020 in parallel.

In an embodiment, the width of each of the transistors/switches 1016-1 . . . 1016-4 is about 1.22±0.2 mm. Having transistors measuring in the millimeters minimizes or otherwise reduces the on-resistance, and by extension, boosts efficiency. However, increasing the widths also increases the input capacitance leading to increased switching RC time constants and higher rise/fall times. In order to achieve lower nominal RC time constants, it helps to have lower charging resistance associated with the driver circuit. Thus, an inverter with lower charging resistance may be utilized to drive the class D PA circuit 832. This disclosure has identified that driving ~1.22 mm wide switches requires 4V±0.5 voltage swing. An upconvert stage, e.g., upconvert stage 601, implemented using a 65 nm CMOS process supports a supply voltage of 1.2V. When such a 65 nm CMOS ASIC is interfaced via a 50 ohm termination to a GaN IC, e.g., the output stage 802, the maximum input swing obtained at the input of PA is 600 mVpp. Therefore, this necessitates the design of a driver circuit preceding the PA, details of which will now be explained in greater detail. Note that the present disclosure is not necessarily limited to having a driving circuit with amplification if the upconvert stage is capable of providing a sufficient swing voltage.

Returning to FIG. 8A, the push-pull drivers will now be discussed in greater detail. As discussed above, the transistors 1016-1 . . . 1016-4 may be relatively wide with widths running in the order of millimeters (e.g., 1.2 mm±0.2 mm). This is done to minimize the on-resistance and subsequently boost efficiency. However, increasing the widths also increases the input capacitance leading to increased switching RC time constants and higher rise/fall times. In order to achieve lower RC time constants, it helps to have lower charging resistance associated with the driver circuit. Hence, inverters with their lower charging resistances are particular well suited for implementing a driver circuit for PAs. Besides lower charging resistance, inverters are also quite power efficient as they do not have static power losses.

Apart from driving the higher input capacitance with lower charging resistance, another aim for the PA driver is to provide a high peak to peak voltage swing, e.g., 4 Vpp, to turn on the power transistor. Conventional CMOS technologies with their breakdown voltage limitations are incapable of providing such a high voltage swing. High voltage RF power amplifier drivers using extended drain MOS devices in baseline 65 nm CMOS technology are known to be capable of providing 9.6 Vpp swing while driving a 3 pF load capacitance operating from 0.5 GHz to 4 GHz. However, interfacing such a driver with a GaN output driver, e.g., output stage 802, involves the use of chip to chip bond wire connections which deteriorates the broadband performance. Such deterioration is due to low pass networks formed by bond inductance and input capacitance of the subsequent output stage.

With the forgoing in mind, and in accordance with an embodiment, the first and second push-pull drivers/inverters are implemented on the same chip as the first and second PAs 832-1, 832-2, which eliminates the necessity to have bondwire connections or other interconnects before the final output stage, and thereby renders broadband performance. GaN technology offers benefits in terms of its higher breakdown voltage and transit frequency solving the problem of obtaining a necessary voltage swing, e.g., 4 Vpp swing at 1 GHz frequency.

Figure 11:
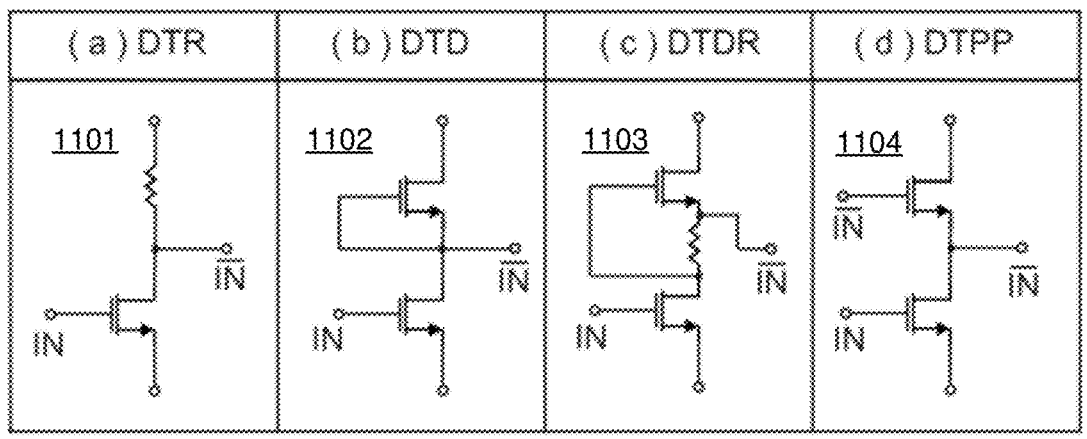
FIG. 11 illustrates a plurality of inverter circuits suitable for driving the amplifier circuit of FIG. 10.

Turning to FIG. 11, with additional reference to FIG. 8A, a plurality of example inverter topologies using non-complementary transistors are shown that are suitable for use within the push-pull drivers 831-1, 831-2. Each of the plurality of topologies has different qualities with regard to speed and power consumption and will be briefly touched upon in turn.

The depletion mode transistor with resistor as a load depicted and abbreviated as DTR 1101 is one of the simplest types of inverters. The problem with this configuration is the large current flow when the base transistor is turned on, leading to high losses. Also, DTR 1101 is slow in terms of rise and fall times because of the involved resistance.

Another variant of an inverter implementation using non-complementary transistors is the DTD type 1102, which consists of a depletion mode base and load transistors. The DTD 1102 configuration provides an active variable load resistance. During on-state of the base transistor, the load resistance is high, yielding a better low state. It also exhibits faster switching behavior in comparison to the DTR case. However, the static power losses still persist in this configuration as well.

A variant of DTD is the DTDR 1103 which consists of depletion mode transistor as the base transistor and a depletion mode transistor in series with a resistor as the load. This configuration provides higher load resistance during on-state of the base transistor relative to the inverter 1101 due to attainment of negative VGS by virtue of voltage drop across the series resistance. This yields better switching behavior and lower static power consumption relative to the DTR 1101.

The final inverter circuit shown in FIG. 11 includes a depletion mode base and load transistors in push-pull configuration 1104 abbreviated as DTPP. Its principle of operation is similar to an ideal inverter. Static power dissipation in this configuration is almost negligible. Also, it is the fastest among the inverter configurations 1101 . . . 1103. One problem associated with this topology is the high input voltage swing needed to sustain rail-to-rail output swing. To be more precise, if a 0 to VDD swing is needed at the output of the driver, the driver itself must be driven with a voltage swing of 0 to VDD. Thus, the signal driving the inverter topology 1104 may need amplification. One way to achieve such amplification is by including a differential amplifier within the output stage 802, such as the amplifiers 830-1 and 830-2 provided within the two-stage driving circuit 841 discussed above with regard to FIG. 8A.

Figure 12:
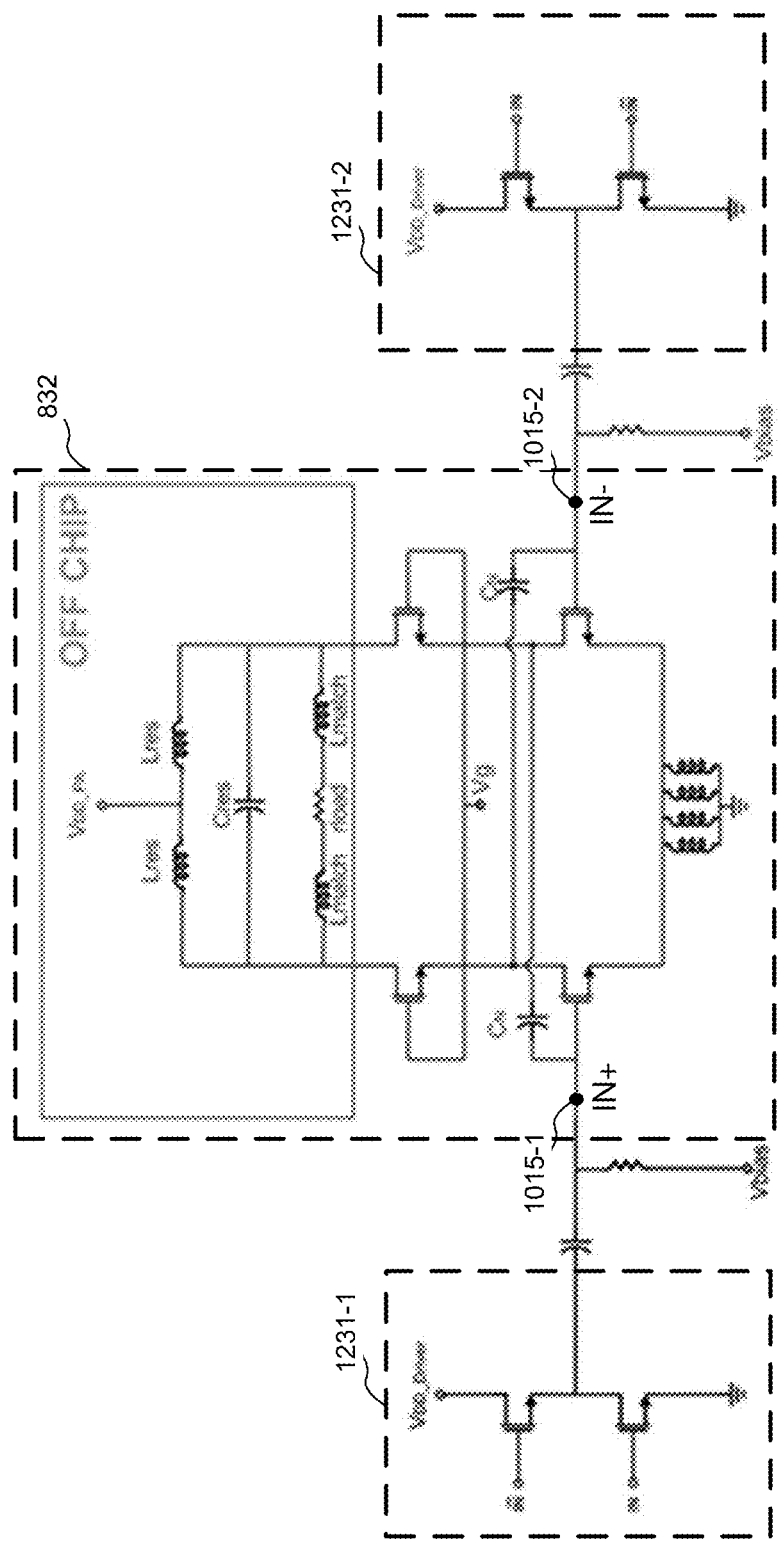
FIG. 12 shows a schematic view of the example inverse Class-D switch mode amplifier circuit of FIG. 10 with inputs coupled to associated driving circuitry, in accordance with an embodiment of the present disclosure.

Turning to FIG. 12, a circuit schematical shows a first and second push-pull inverter circuit 1231-1, 1231-2 coupled to input terminals 1015-1, 1015-2 respectively of the inverted class D PA circuit 832. As shown, the push-pull inverter circuits 1231-1, 1231-2 are implemented with DTPP inverter configurations 1104 discussed above with reference to FIG. 11.

GaN Output Stage Simulations

Figure 13:
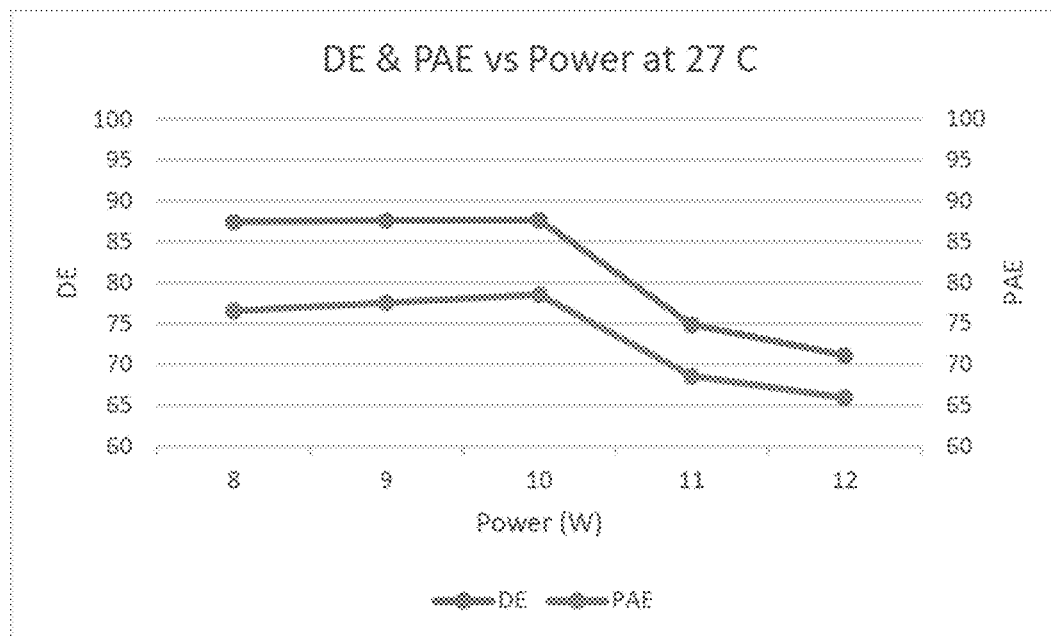
FIG. 13 is a graph that illustrates drain efficiency and peak added efficiency for the amplifier circuit of FIG. 10 when operated at about 27 degrees Celsius.

A simulation was performed by driving the output stage 602/802 implemented in GaN with ideal voltage pulses of 325 mV amplitude having rise and fall times of 100 ps. Turning to FIG. 13, a graph illustrates drain efficiency (DE) and peak power added efficiency (PAE) versus power at a temperature of 27° C. Taking into consideration losses incurred in the matching network, peak drain efficiency and peak power added efficiency were calculated to be 87.6% and 78.52%, respectively, for an output power of 10 W at a frequency of 1 GHz at temperature of 27° C. To observe the trend of efficiency at different powers, the supply voltage was swept to give the results shown in FIG. 13. One can observe that the drain efficiency and power added efficiency are maximum for the designed output power of 10 W. However, one can see degradation in efficiency with increase in output power by scaling the supply voltage.

Figure 14:
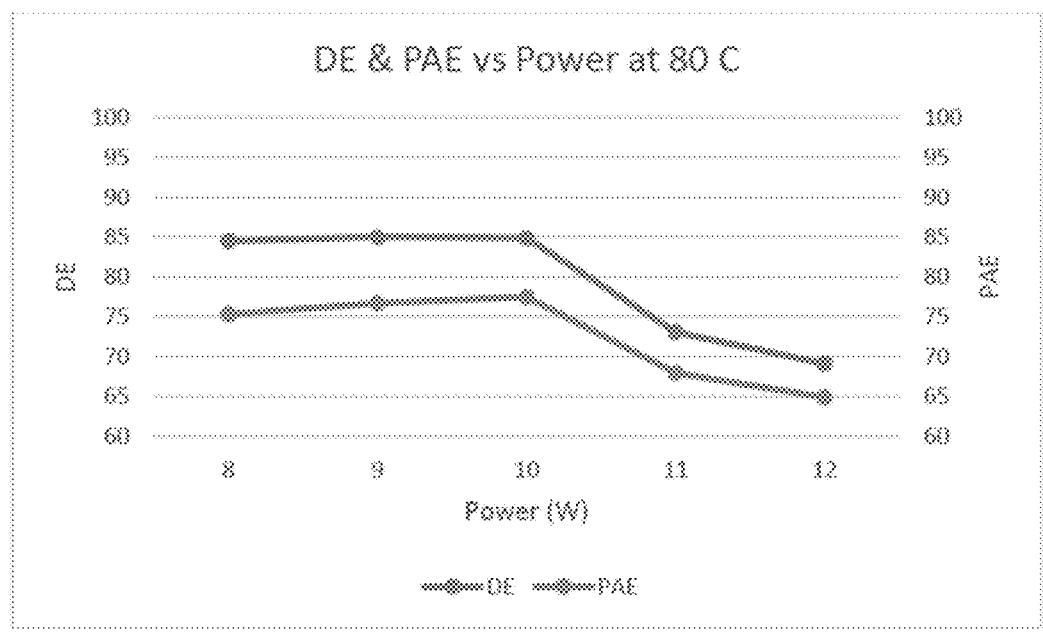
FIG. 14 is a graph that illustrates drain efficiency and peak added efficiency for the amplifier circuit of FIG. 10 when operated at about 80 degrees Celsius.

FIG. 14 shows the DE and PAE versus power when the ambient chip temperature is set to 80° C. As shown, the heating of the chip while delivering high output power was taken into account in another set of simulations with the ambient chip temperature set to 80° C.

Peak drain efficiency and peak power added efficiency reduce slightly to 84% and 77.5% respectively for an output power of 10 W at a frequency of 1 GHz. A similar plot for different powers was plotted yielding the same trend as before.

Figure 15:
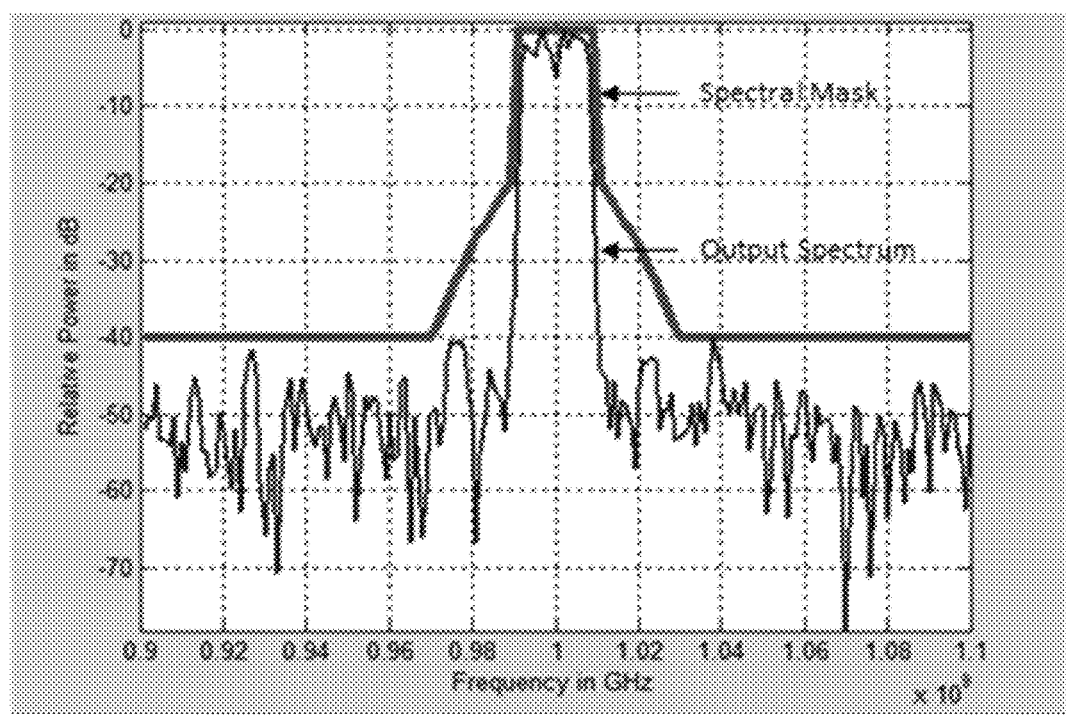
FIG. 15 is a graph illustrating the output spectrum of the amplifier circuit of FIG. 10 relative to a target spectral mask when operating with an 802.11a signal as an input.

FIG. 15 is a graph illustrating the output spectrum of the amplifier circuit of FIG. 10 relative to a target spectral mask when operating with an 802.11a signal as an input.

Consistent with an aspect of the present disclosure a transmitter system is disclosed. The transmitter system including output stage comprising a Gallium Nitride (GaN) power amplifier (PA) circuit having a Modified Current Mode Class-D (CMCD) configuration, the GaN PA circuit including, a lower switching device electrically coupled to an input to receive an input RF signal, an upper switching device to switchably couple the first switching device to a power supply to drive an antenna circuit based on the input RF signal, and wherein the lower and upper switching devices form a first transistor cascode arrangement.

Consistent with another aspect of the present disclosure a method for digitally upconverting an intermediate frequency (IF) signal is disclosed. The method comprising receiving a first outphased signal ($V_I$) and a second outphased signal ($V_Q$), multiplying the first outphased signal ($V_I$) with a first multi-level digital clock signal ($LO_I(t)$) to provide a first digitally upconverted signal at a first carrier frequency, and multiplying the second outphased signal ($V_Q$) with a second multi-level digital signal ($LO_I(q)$) to provide a second digitally upconverted signal at the first carrier frequency.

Consistent with another aspect of the present disclosure transmitter device is disclosed. The transmitter device comprising an upconvert circuit having a plurality of stages to digitally upconvert outphased IF signals and provide an upconverted outphased digital RF signal, an output stage comprising an amplification circuit to receive the outphased digital RF signal and generate a driving signal based on outphased digital RF signal, a driving circuit comprising an inverter circuit to drive a Gallium Nitride (GaN) power amplifier (PA) circuit based on the driving signal, the GaN PA circuit, the GaN PA circuit having a Current Mode Class-D (CMCD) configuration, the GaN PA circuit including a lower switching device electrically coupled to the driving circuit to receive the driving signal, and an upper switching device to switchably couple the first switching device to a power supply to drive an antenna circuit based on the driving signal, and wherein the lower and upper switching devices form a first transistor cascode arrangement.

While the principles of the disclosure have been described herein, it is to be understood by those skilled in the art that this description is made only by way of example and not as a limitation as to the scope of the disclosure. Other embodiments are contemplated within the scope of the present disclosure in addition to the exemplary embodiments shown and described herein. Modifications and substitutions by one of ordinary skill in the art are considered to be within the scope of the present disclosure, which is not to be limited except by the following claims.

What is claimed is:

1. A transmitter system comprising:
    an output stage comprising:
        a Gallium Nitride (GaN) power amplifier (PA) circuit having a Modified Current Mode Class-D (CMCD) configuration, the GaN PA circuit including:
            a lower switching device electrically coupled to an input to receive an input RF signal;
            an upper switching device to switchably couple the first switching device to a power supply to drive an antenna circuit based on the input RF signal; and
            wherein the lower and upper switching devices form a first transistor cascode arrangement;
    wherein the GaN PA circuit operates at a peak drain efficiency between 80% to 85% when operating at a frequency of substantially 1 Gigahertz (GHz) and has an output power substantially equal to 10 Watts (W).

2. The transmitter system of claim 1, wherein the GaN PA circuit includes a second cascode transistor arrangement, the first and second cascode switching arrangements forming an inverse CMCD configuration.

3. The transmitter system of claim 1, wherein the upper switching device of the first cascode transistor arrangement is 1.22±0.2 millimeters wide.

4. The transmitter system of claim 1, wherein the upper switching device and the lower switching device of the first cascode transistor arrangement comprise GaN field-effect transistor devices (FETs).

5. The transmitter system of claim 1, wherein the upper switching device and/or the lower switching device comprise high-voltage GaN high electron mobility transistor (HEMT) devices.

6. The transmitter system of claim 1, further comprising the antenna driving circuit, and wherein the antenna driving circuit is implemented on a different chip than the GaN PA circuit.

7. The transmitter system of claim 1, further comprising a digital upconvert stage, the digital upconvert stage comprising:
    an intermediate frequency (IF) processor for receiving a first signal (I(t)) representing an in-phase component of an output waveform and a second signal (Q(t)) representing the quadrature component of the output waveform, and outputting a first and second set of outphased IF signals; and
    digital upconvert circuitry to receive the first and second set of outphased IF signals and digitally upconvert the first and second set of outphased IF signals to provide the RF signal for driving the GaN PA circuit.

8. The transmitter system of claim 7, wherein the digital upconvert stage is implemented as a complementary metal-oxide semiconductor (CMOS) application-specific integrated circuit (ASIC).

9. The transmitter system of claim 7, wherein the digital upconvert stage and the output stage are electrically coupled via a 50 ohm terminated transmission line.

10. A method for digitally upconverting an intermediate frequency (IF) signal, the method comprising:
    receiving a first outphased signal ($V_I$) and a second outphased signal ($V_Q$),
    multiplying the first outphased signal ($V_I$) with a first multi-level digital clock signal ($LO_I(t)$) to provide a first digitally upconverted signal at a first carrier frequency; and multiplying the second outphased signal ($V_Q$) with a second multi-level digital clock signal ($LO_I(q)$) to provide a second digitally upconverted signal at the first carrier frequency;

wherein the first and second multi-level digital clock signals each comprise signal levels of −1V, 0V, and +1V.

11. The method of claim 10, further comprising summing the first and second outphased signals to derive an RF signal to provide to a PA stage based on the following equation:

$$Y_1(t) = V_I \times LO_I(t) + V_Q \times LO_Q(t).$$

12. A transmitter system comprising:
an output stage comprising:
a Gallium Nitride (GaN) power amplifier (PA) circuit having a Modified Current Mode Class-D (CMCD) configuration, the GaN PA circuit including:
a lower switching device electrically coupled to an input to receive an input RF signal;
an upper switching device to switchably couple the first switching device to a power supply to drive an antenna circuit based on the input RF signal; and
wherein the lower and upper switching devices form a first transistor cascode arrangement; and
wherein the upper switching device of the first cascode transistor arrangement is 1.22±0.2 millimeters wide.

13. The transmitter system of claim 12, wherein the GaN PA circuit operates at a peak drain efficiency between 80% to 85% when operating at a frequency of substantially 1 Gigahertz (GHz) and an output power substantially equal to 10 Watts (W).

14. The transmitter system of claim 12, wherein the upper switching device and the lower switching device of the first cascode transistor arrangement comprise GaN field-effect transistor devices (FETs).

15. The transmitter system of claim 12, wherein the upconvert circuit is implemented as a complementary metal-oxide semiconductor (CMOS) application-specific integrated circuit (ASIC) and is electrically coupled to the output stage via a 50 ohm terminated transmission line.

16. The transmitter system of claim 12, further comprising an upconvert circuit having a plurality of stages to digitally upconvert outphased IF signals and provide an upconverted outphased digital RF signal; and
wherein the output stage further comprises:
an amplification circuit to receive the outphased digital RF signal and generate a driving signal based on outphased digital RF signal; and
a driving circuit comprising an inverter circuit to drive said GaN PA circuit based on the driving signal.

17. A transmitter system comprising:
an output stage comprising:
a Gallium Nitride (GaN) power amplifier (PA) circuit having a Modified Current Mode Class-D (CMCD) configuration, the GaN PA circuit including:
a lower switching device electrically coupled to an input to receive an input RF signal;
an upper switching device to switchably couple the first switching device to a power supply to drive an antenna circuit based on the input RF signal; and
wherein the lower and upper switching devices form a first transistor cascode arrangement; and
wherein the GaN PA circuit includes a second cascode transistor arrangement, the first and second cascode switching arrangements forming an inverse CMCD configuration.

18. The transmitter system of claim 17, wherein the upper switching device of the first cascode transistor arrangement is 1.22±0.2 millimeters wide.

19. The transmitter system of claim 17, wherein the GaN PA circuit operates at a peak drain efficiency between 80% to 85% when operating at a frequency of substantially 1 Gigahertz (GHz) and has an output power substantially equal to 10 Watts (W).

20. A transmitter system comprising:
an output stage comprising:
a Gallium Nitride (GaN) power amplifier (PA) circuit having a Modified Current Mode Class-D (CMCD) configuration, the GaN PA circuit including:
a lower switching device electrically coupled to an input to receive an input RF signal;
an upper switching device to switchably couple the first switching device to a power supply to drive an antenna circuit based on the input RF signal; and
wherein the lower and upper switching devices form a first transistor cascode arrangement;
wherein the output stage further comprises a two-stage driver circuit, the two-stage driver circuit comprising:
a first stage to receive a digital outphased intermediate frequency (IF) signal and generate a driving signal based on the digital outphased IF signal;
a second stage comprising an inverter circuit to couple to the input of the GaN PA circuit and drive the GaN PA circuit based on the driving signal; and
wherein the driving signal provides a 0 to $V_{DD}$ swing sufficient to switch on the lower switching device of the first cascode transistor arrangement.

21. The transmitter system of claim 20, wherein the two-stage driver circuit and the GaN PA driving circuit are implemented on the same chip.

* * * * *